United States Patent
Takahashi et al.

(10) Patent No.: US 7,642,773 B2
(45) Date of Patent: Jan. 5, 2010

(54) MAGNETIC SENSOR, PRODUCTION METHOD THEREOF, ROTATION DETECTION DEVICE, AND POSITION DETECTION DEVICE

(75) Inventors: Yoshinori Takahashi, Otsuki (JP); Naoki Nakase, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/708,581

(22) Filed: Feb. 21, 2007

(65) Prior Publication Data
US 2007/0194787 A1    Aug. 23, 2007

(30) Foreign Application Priority Data
Feb. 23, 2006   (JP)   ............... 2006-046433

(51) Int. Cl.
H01L 43/08   (2006.01)
G01R 33/09   (2006.01)
G01B 7/14    (2006.01)
G01B 7/30    (2006.01)

(52) U.S. Cl. .................. 324/207.21; 324/252

(58) Field of Classification Search ............ 324/207.21, 324/252, 207.23, 207.24, 207.25, 244, 247, 324/249, 251, 260; 338/32 R; 360/313, 360/315
See application file for complete search history.

(56) References Cited

U.S. PATENT DOCUMENTS

| | | | | |
|---|---|---|---|---|
| 6,115,261 A * | 9/2000 | Platt et al. | .................... | 361/760 |
| 6,169,254 B1 * | 1/2001 | Pant et al. | .................... | 174/254 |
| 7,126,330 B2 * | 10/2006 | Peczalski et al. | ............ | 324/247 |
| 7,221,157 B2 * | 5/2007 | Wakabayashi et al. | ...... | 324/251 |
| 7,290,448 B2 * | 11/2007 | Shirasaka et al. | ............. | 73/493 |
| 2004/0103530 A1 * | 6/2004 | Adachi et al. | .................. | 29/854 |
| 2006/0176142 A1 * | 8/2006 | Naito et al. | ................ | 338/32 R |
| 2007/0015316 A1 * | 1/2007 | Madrid et al. | ................ | 438/123 |

FOREIGN PATENT DOCUMENTS

| | | |
|---|---|---|
| JP | 2512435 | 7/1996 |
| JP | 8-338863 | 12/1996 |
| JP | 2004-128474 | 4/2004 |
| JP | 2004-354182 | 12/2004 |

* cited by examiner

Primary Examiner—Kenneth J Whittington
(74) Attorney, Agent, or Firm—Young & Thompson

(57) ABSTRACT

A one-chip type magnetic sensor is provided in which thin-film anisotropic magnetoresistance elements are formed on an IC substrate. Applied magnetic fields can be detected in the magnetic sensor in vertical and horizontal directions, and detection sensitivity can be adjusted with respect to direction. The influence on a magnetic-sensitive property can be suppressed when another magnetic field is applied from another direction. A semiconductor substrate, lead frame, and lead frame(s) are accommodated in a package in the magnetic sensor. Thin-film magnetoresistance elements are formed on the substrate, which includes an electric circuit having comparison and amplification functions. The lead frame is used to mount the semiconductor substrate thereon. The lead frames are connected to the semiconductor substrate, which is attached to a semiconductor attachment surface. The lead frame has a structure in which the semiconductor attachment surface is inclined with respect to a package surface by bending the lead frame.

8 Claims, 6 Drawing Sheets

F I G. 2
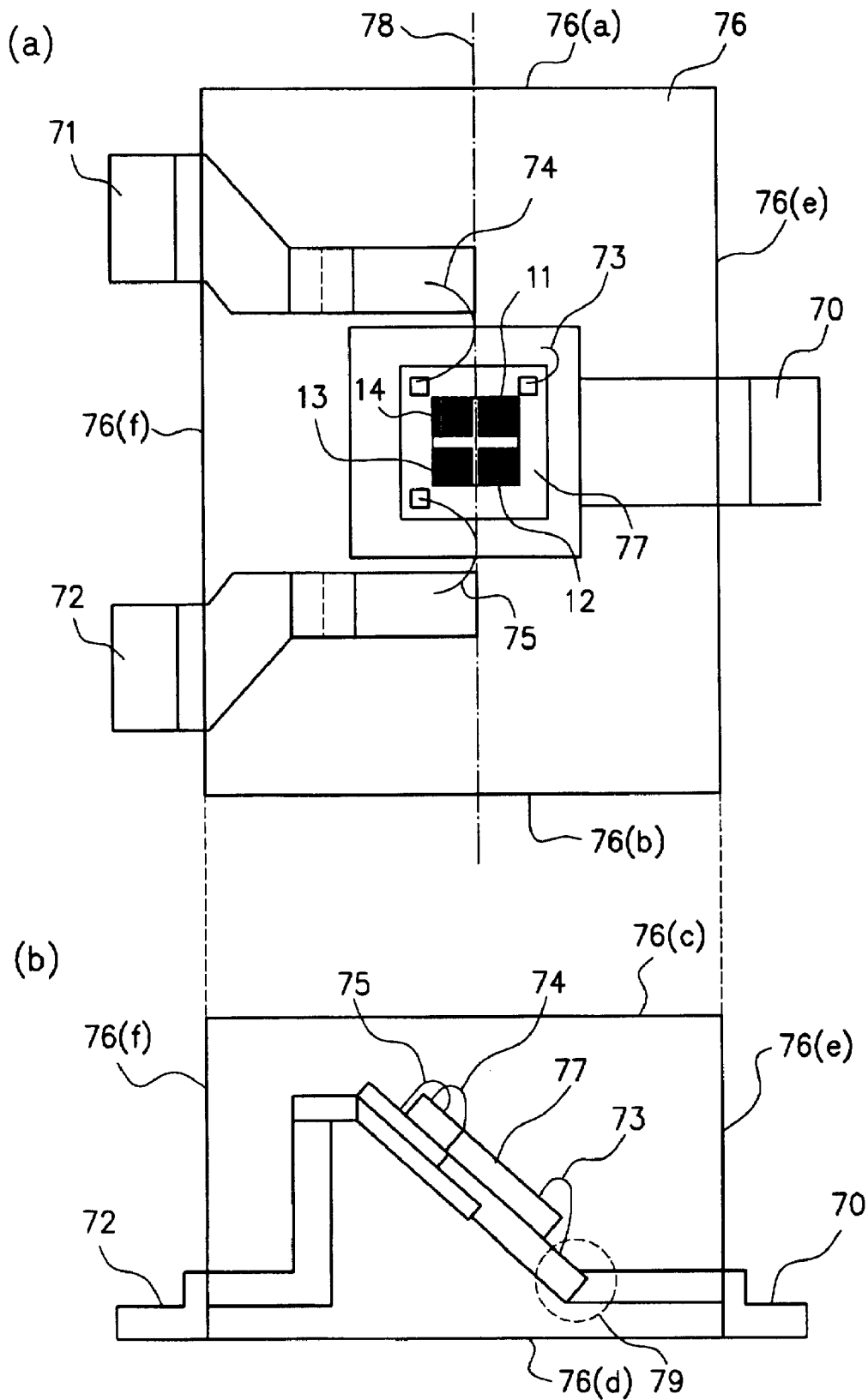

MAGNETIC SENSOR, PRODUCTION METHOD THEREOF, ROTATION DETECTION DEVICE, AND POSITION DETECTION DEVICE

BACKGROUND OF THE INVENTION

1. Field of the Invention

The present invention relates to a magnetic sensor, a production method thereof, a rotation detection device, and a position detection device, particularly to a magnetic sensor that detects a magnetic field while incorporated into a device for detecting rotation or position of an object.

2. Description of the Related Art

Conventionally, examples of a magnetic sensor used to detect rotation or position of an object include a Hall sensor in which the Hall effect is utilized, a GMR (Giant Magnetoresistance) sensor in which the giant magnetoresistance effect is utilized, and an AMR (Anisotropic Magnetoresistance) sensor in which the anisotropic magnetoresistance effect is utilized. The Hall effect is a phenomenon that when a magnetic field is vertically applied to a plate through which electric current is running, electromotive force is generated in a direction perpendicular to both the magnetic field and the current. Accordingly, in principle the Hall sensor cannot sense a magnetic field parallel to a substrate (thin film).

The GMR effect is a phenomenon that, when the current is running through a thin film having a three-layer structure (ferromagnetic material, non-magnetic material and again ferromagnetic material), a scattering probability of electrons flowing in the non-magnetic material layer is changed according to a relative angle of magnetization of the ferromagnetic material layers, and thereby electrical resistance changes. The AMR effect is a phenomenon that the resistance changes according to an angle formed between a magnetization direction of a magnetic film and a direction of the current running through the magnetic film. Examples of the magnetic film include Ni and Fe films. In the AMR film, a rate of resistance change to the external magnetic field is not too large when compared with the GMR film. However, unlike the GMR film, the AMR magnetic film has not the multi-layer structure but a monolayer structure.

GMR differs from AMR in the following points; (1) GMR has an incommensurably large magnetoresistance ratio, (2) GMR is independent of an angle formed between current flow and orientation of magnetic field during resistance measurement, (3) GMR has a complicated layer structure. Therefore, although a GMR sensor has the same purpose of the magnetic detection as an AMR sensor, the GMR sensor differs completely from the AMR sensor in the structure and action.

A magnetic sensor with a magnetoresistance element made of this kind of ferromagnetic metal uses the magnetoresistance effect possessed by ferromagnetic material. Namely, the magnetic sensor utilizes changes in electrical resistance when the distribution of electrons is distorted by a magnetic field, and electrons energetically stabilize and compensate the distortion. A magnetic sensor has magnetoresistance elements with a meandering structure where the angle formed between orientation of the applied magnetic field and the direction of the current running through the magnetoresistance element is 90°, and magnetoresistance elements with a meandering structure where the angle between orientation of the applied magnetic field and the direction of the current running through the magnetoresistance element is 0°. The magnetoresistance elements are connected serially, and the connection point of the magnetoresistance elements is connected to an input of a comparator circuit to recognize a difference voltage at a middle of the series-resistance structure and amplify it for magnetic detection.

The magnetic sensor receives a horizontal component of the applied magnetic field and detects the change in resistance of a thin-film magneto-resistor formed on an IC substrate. The magnetic sensor does not react to the external magnetic field applied from a direction (Z axis direction) perpendicular to the substrate. Four resistance elements arranged in different angles are formed in a bridge shape, the magnetic field is detected by a potential difference between the resistance elements, and a magnetic sensitive property depends on the direction (X-Y axes direction) of the applied magnetic field.

The magnetic field is referred to as operating magnetic field when the magnetic field is applied at an angle of 90° to the direction of the current running through the magnetoresistance element. On the other hand, the magnetic field is referred to as canceling magnetic field when the magnetic field is applied at an angle of 0° to the direction of the current running through the magnetoresistance element. The basic operation of the magnetic sensor will briefly be described with reference to FIGS. 5 and 6.

FIG. 5 shows a basic circuit configuration of a conventional magnetic sensor. Referring to FIG. 5, magnetoresistance elements 11 to 14 are formed in the bridge shape in a magnetoresistance element unit 10, and a comparator 21 and a feedback resistance 22 are arranged in an IC circuit waveform processing unit 20 so as to have comparison and amplification functions.

FIG. 6 shows the magnetoresistance element unit 10. The magnetoresistance elements 11 and 13 have continuous meandering structures that look like vertical strips, and are formed on the substrate. The magnetoresistance elements 12 and 14 have continuous meandering structures that look like horizontal strips, and are formed on the substrate. Among the four magnetoresistance elements 11 to 14, the magnetoresistance elements having the strips of the different directions are connected to each other to form a bridge.

In this case, the magnetoresistance elements 11 and 13 are resistors that respond to the operating magnetic field, and the magnetoresistance elements 12 and 14 are resistors that respond to the canceling magnetic field. When the magnetic field is applied from the left direction of FIG. 6, resistances of the magnetoresistance element 11 and 13 changes by the magnetoresistance effect, which results in a change in potential at a middle point 16 between the magnetoresistance element 11 and 14. Similarly the potential changes at a middle point 17 between the magnetoresistance element 12 and 13. Using a difference voltage between the middle points 16 and 17, the comparator 21 and the feedback resistance 22 in the IC circuit waveform processing unit 20 perform the comparison and amplification to detect the change in magnetic field.

The conventional package structure will be described with reference to FIG. 7. FIG. 7 shows a schematic configuration of the conventional magnetic sensor where FIG. 7A is a top view and FIG. 7B is a side view. The circuit shown in FIG. 5 is arranged on a semiconductor substrate 47, and the circuit has the magnetoresistance elements shown in FIG. 6. The semiconductor substrate 47 on which the thin-film magnetoresistance element is formed on the IC substrate is mounted on a lead frame 40, and the semiconductor substrate 47 is connected to lead frames 40 to 42 by wires 43 to 45 (wire bonding). The lead frames 40 to 42 act as a connection terminal to the outside of a mold-sealed package 46. The semiconductor substrate 47 is mounted in parallel with the surface of the package 46.

The thin-film magnetoresistance elements 11 and 13 respond to the magnetic field in the horizontal direction (X-Y axes direction) parallel to the package surface, i.e., the magnetic fields applied through package surfaces 46*a* and 46*b*, while the magnetoresistance elements 11 and 13 do not respond to the magnetic fields applied through package surfaces 46*c* and 46*d*. That is, the magnetoresistance elements 11 and 13 sense the magnetic field in the horizontal direction but cannot sense the magnetic field in the vertical direction.

In the conventional magnetic sensor, the magnetic fields applied through package surfaces 46*e* and 46*f* are recognized as the canceling magnetic field, and the resistance values of the magnetoresistance elements 12 and 14 are changed. Therefore, the magnetic sensor operates in a direction that the detection is cancelled. Detecting sensitivity of a magnetic sensor in the magnetic field varies depending on whether a magnetic field in the canceling direction exists or not. Therefore, in the conventional magnetic sensor, in the case of the presence of the canceling magnetic field, the influence of the canceling magnetic field cannot be compensated unless the magnetic field equal to or larger than the canceling magnetic field is applied in the magnetic-sensor operating direction.

A relationship between a resistance value of a magneto-resistor and an insertion angle of an applied magnetic field will be described with reference to FIGS. 8 and 9. FIG. 8 is a front view of the magneto-resistor when the magnetic field is applied in parallel (X-Y axes direction) with a surface of the magneto-resistor. FIG. 9 is a top view of the magneto-resistor when the magnetic field is applied while having an angle with respect to the surface of the magneto-resistor.

Conventionally, in a magneto-resistor 53 made of ferromagnetic material, a resistance change amount depends on an insertion angle 50 ($\theta$ in the following equation (1)) formed by the direction of the applied magnetic field 52 and current running through the magneto-resistor 53, as expressed by equation (1):

$$\rho = \rho 0 - \Delta \rho \cdot \sin 2\theta, \quad (1)$$

where $\rho$ is a resistance value after the magneto-resistor 53 is changed, $\rho 0$ is an initial value of the magneto-resistor 53, and $\Delta \rho$ is an amount of a resistance change of the magneto-resistor 53.

As shown in FIG. 8, the resistance change amount caused by the applied magnetic field appears directly as the change in resistance for the magnetic field when $\theta$ of the insertion angle 50 is set at 90°. On the other hand, $\Delta \rho$ becomes zero for the magnetic field that is applied where $\theta$ is 0°, and no change occurs. That is, the magnetic field applied at $\theta$ of 90° means that the magnetic field is applied in the operating direction, and the magnetic field applied at $\theta$ of 0° means that the magnetic field is applied in the canceling direction.

The case in which the direction of the applied magnetic field 52 has an angle (in the Z axis direction) relative to the surface of the magneto-resistor while $\theta$ of the insertion angle 50 is maintained at 90° in the X-Y axes plane will be described below. As shown in FIG. 9, when the magneto-resistor 53 is inclined by 45° toward the Z axis direction (inclinations 56 and 54 are set at 45° for example) while $\theta$ is maintained at 90° in the X-Y axes plane, a magnetic field component 55 in the X-Y axes direction, horizontal to the magneto-resistor 53, is $1/\sqrt{2}$ times the value of the magnetic field 52. When a magnetic field 58 is applied from above the magneto-resistor 53, a magnetic field component 57 in the X-Y axes direction, horizontal to the magneto-resistor 53, is $1/\sqrt{2}$ times the value the magnetic field 58. The magneto-resistor 53 detects the magnetic field 55 or 57 and operates based on the equation (1).

Japanese Utility Model Registration No. 2512435 (Document 1) discloses that a Hall element is mounted on a substrate of a peripherally opposing motor and is arranged while inclined relative to a magnet such that the surface of a magnetic sensitive unit of the Hall element intersects a main magnetic flux generated by the magnet. Therefore, the magnetic field is readily sensed to improve performance of the device. However, Document 1 does not disclose a resistance element made of ferromagnetic material, but only relates to a Hall element. Additionally, Document 1 does not aim to increase directions of magnetic field detection, but only tilts a Hall element so that a magnetic field is easily detected. Therefore, when the magnetic field is applied from another direction, there is no function of suppressing the influence of the magnetic field on the magnetic sensitive property.

Japanese Patent Application Laid-Open (JP-A) No. 8-338863 (Document 2) discloses that a recess is formed in an inner surface to locate the magnetoresistance element in the magnetic detection device arranged close to various motors to detect a rotational position or a revolving speed of a rotary body. Document 2 emphasizes accurate measurement where the resistance element is inclined to detect the clockwise or counterclockwise rotation of the rotary body including opposite permanent magnets. However, the purpose and the effect differ from the present invention.

JP-A No. 2004-128474 (Document 3) discloses a method of producing a two-chip-built-in magnetic sensor where two magnetic sensor chips are mounted on a stage of a particular lead frame to detect the magnetic field from three-dimensional directions. In the production method, the magnetic sensor is produced while the two magnetic sensor chips are inclined relative to the substrate. One of the magnetic sensor chips detects the magnetic field in the horizontal direction (X-Y axes direction), and the other magnetic sensor chip detects the magnetic field in the vertical direction (Z axis direction). Document 3 discloses the production method and differs from the present invention in that the magnetic sensor needs the magnetic sensor chips for the horizontal and vertical directions respectively. Additionally, because Document 3 seeks accurate measurement of the orientation and reduction of production cost, the objectives are different from the present application.

JP-A No. 2004-354182 (Document 4) discloses a thin-film magnetic sensor and a production method thereof. The thin-film magnetic sensor can detect the external magnetic field in the direction perpendicular to the surface of an insulating substrate. An irregular (bumpy) portion and a pair of thin-film yoke (collective name of iron and the like constituting the magnetic circuit) are formed on the insulating substrate, and the GMR film is formed in a gap between the thin-film yokes. Additionally, two sensor units are provided. That is, one of the sensor units detects the external magnetic field in the horizontal direction, and the irregular portion is formed on the substrate to incline the GMR film, which allows the other sensor unit to detect the external magnetic field in the vertical direction. Because the GMR effect is utilized in the technique, the technique differs from the present invention in the fundamental effect and the two-chip configuration.

A first problem with the conventional magnetic sensor is that the magnetic sensor responds to the horizontally applied magnetic field while not being able to respond to the vertically applied magnetic field. This is attributed to characteristics of the magnetoresistance element. Usually the thin-film magneto-resistor formed on the IC substrate responds to only the magnetic field that is horizontally applied through a package side face.

A second problem comes up from the design of a conventional magnetic sensor where the magneto-resistors each having the continuously folded structure are arranged so that vertical strip magneto-resistors and horizontal strip magneto-resistors are alternated. When the magnetic field is applied in the magnetic sensor's operating direction that forms an angle of 90° with the current running through the magnetoresistance element while the magnetic field of the canceling direction (an angle of 0°) is simultaneously applied, the influence on the canceling magnetic field cannot be compensated unless the magnetic field of the same intensity as the canceling magnetic field is applied in the magnetic-sensor operating direction.

The reason is that due to the orientation of the magneto-resistors having the continuously folded structures, even if the insertion angle of the applied magnetic field becomes 0° with respect to some of the magneto-resistors, the insertion angle to other magneto-resistors becomes 90° to respond to the magnetic field applied in the canceling direction. Therefore, the potential fluctuates at the connection point where the magneto-resistors are connected in series, and the input potential of the comparator circuit reversely changes. When a magnetic field is applied in the canceling direction while the operating magnetic field is applied, the sensitivity is changed and the original magnetic sensing characteristics of a magnetic sensor cannot be obtained. The problem cannot be avoided due to the structure of the sensor. Under the condition that the canceling magnetic field is applied, the magnetic field equal to or larger than the canceling magnetic field must be applied in the direction where the influence of the canceling magnetic field is compensated.

SUMMARY OF THE INVENTION

In view of the foregoing, an objective of the present embodiments is to provide a one-chip type magnetic sensor in which thin-film anisotropic magnetoresistance elements are formed on an IC substrate. The magnetic sensor detects magnetic fields in the vertical and horizontal directions, and the detection sensitivity can be adjusted with respect to the direction of an applied magnetic field. Further, the influence on the magnetic sensitive property can be suppressed even if magnetic fields of different orientations are applied.

According to a first aspect of the embodiments, a magnetic sensor that detects an applied magnetic field and converts the magnetic field into an electric output comprises a magnetoresistance element unit including meandering magnetoresistance elements, and an IC circuit waveform processing unit including a comparator circuit and a feedback resistance. The magnetoresistance element unit and the IC circuit waveform processing unit are provided on a substrate. A magnetoresistance element has an anisotropic magnetoresistance effect. The magnetic sensor further comprises a semiconductor substrate connected to the magnetoresistance element unit and the IC circuit waveform processing unit, and lead frames on which the semiconductor substrate is mounted. The semiconductor substrate and the lead frames are accommodated in a package. The magnetoresistance element unit includes magnetoresistance elements that meander in different directions and forms a Wheatstone bridge, and the semiconductor substrate is attached onto a lead frame that slopes against a surface of the package.

In the magnetic sensor according to the first aspect of the embodiments, the semiconductor substrate including the magnetoresistance element unit and the IC circuit waveform processing unit, and the lead frames are accommodated in a package. Thin-film magnetoresistance elements are formed on the magnetoresistance element unit. A magnetoresistance element has the anisotropic magnetoresistance effect, and the magnetoresistance element has a structure that looks like stripes where a magnetoresistance element is continuously folded. There are two kinds of the magnetoresistance elements, i.e., a vertical magnetoresistance element and a horizontal magnetoresistance element. When a vertical magnetoresistance element is rotated by 90°, the vertical element agrees with a horizontal magnetoresistance element. In the magnetoresistance element unit, the vertical magnetoresistance elements and the horizontal magnetoresistance elements are alternately connected, and a Wheatstone bridge is formed by the four magnetoresistance elements. The IC circuit waveform processing unit obtains the potential difference from the two connection points between the vertical magnetoresistance elements and the horizontal magnetoresistance elements on the Wheatstone bridge, and the comparator circuit and the feedback resistance perform the comparison and amplification to detect the change in a magnetic field.

The semiconductor substrate is mounted on the lead frame, and the lead frame is arranged in the package. At this point, because the lead frame is inclined having an angle to the package surface, the semiconductor substrate also slopes against the package surface. The semiconductor substrate's inclination is provided from a lead frame: namely, the lead frame is bent and a slope is provided. The semiconductor substrate is attached before or after a lead frame is bent. In either case, the angle of the semiconductor substrate relative to a package surface is ensured and adjusted by providing the inclination on the lead frame. For example, a V-shape groove that provides a desired angle is cut on the portion where the lead frame is bent. This enhances the accuracy.

According to the above configuration, the magnetic sensor can detect a magnetic field applied in the horizontal direction with respect to a package surface and a magnetic field applied in the vertical direction with respect to a package surface. This is because a magnetoresistance element on the substrate detects the magnetic field component in the horizontal direction by converting the vertically-applied magnetic field into the magnetic field component in the horizontal direction of the semiconductor substrate. The detection sensitivity can be adjusted in the direction to which the magnetic field is applied. This is because, by bending a lead frame that defines a desired angle beforehand, the desired angle can be provided to the semiconductor substrate mounted on the lead frame, or the angle can be adjusted. Additionally, when another magnetic field is applied from another direction, the influence on the magnetic sensitive property can be suppressed. This is because, by providing the angle, another magnetic field from another direction is converted into a magnetic field component in the horizontal direction of the semiconductor substrate, and the magnetic field component in the horizontal direction is detected. That is, for the semiconductor substrate, a magnetic field component converted into the magnetic field in the horizontal direction is smaller than the whole magnetic field. Because an angle can be adjusted, the angle corresponding to a magnetic field other than the applied one may be prepared. The influence on the magnetic sensitive property can be suppressed. The present embodiments can obtain the above effects by the one-chip type semiconductor substrate.

A second aspect according to the invention provides a method of producing a magnetic sensor for performing magnetic detection by detecting an applied magnetic field and converting the magnetic field into an electric output, in which a magnetoresistance element unit and an IC circuit waveform processing unit are provided on a substrate, stripe-shape, continuously folded, thin-film magnetoresistance elements being formed on the magnetoresistance element unit, the magnetoresistance element having an anisotropic magnetoresistance effect, the IC circuit waveform processing unit including a comparator circuit and a feedback resistance to have comparison and amplification functions. A semiconductor substrate and a lead frame are accommodated in a package. The magnetoresistance element unit and the IC circuit waveform processing unit are connected to the semiconductor substrate, the semiconductor substrate being mounted on a lead frame. The method comprises the steps of forming a lead frame by bending the frame portion while an angle of a substrate attachment surface of the stage portion is adjusted with respect to a surface of the package, and attaching the semiconductor substrate to the substrate attachment surface of the stage portion of the lead frame formed through the forming step.

A third aspect according to the embodiments provides a rotation detection device that comprises a magnetic sensor of the first aspect.

A fourth aspect according to the embodiments provides a position detection device that comprises a magnetic sensor of the first aspect.

According to the invention, a one-chip type magnetic sensor in which the thin-film anisotropic magnetoresistance elements are formed on the IC substrate is realized. Applied magnetic fields can be detected in vertical and horizontal directions, the detection sensitivity can be adjusted with respect to the direction of the applied magnetic field, and the influence on the magnetic sensitive property can be suppressed even when a magnetic field is applied from another direction.

BRIEF DESCRIPTION OF THE DRAWINGS

FIG. 2 shows a schematic configuration of a magnetic sensor according to a second embodiment;

DETAILED DESCRIPTION OF THE INVENTION

Preferred embodiments will be described below with reference to the drawings.

First Embodiment

Figure 1:
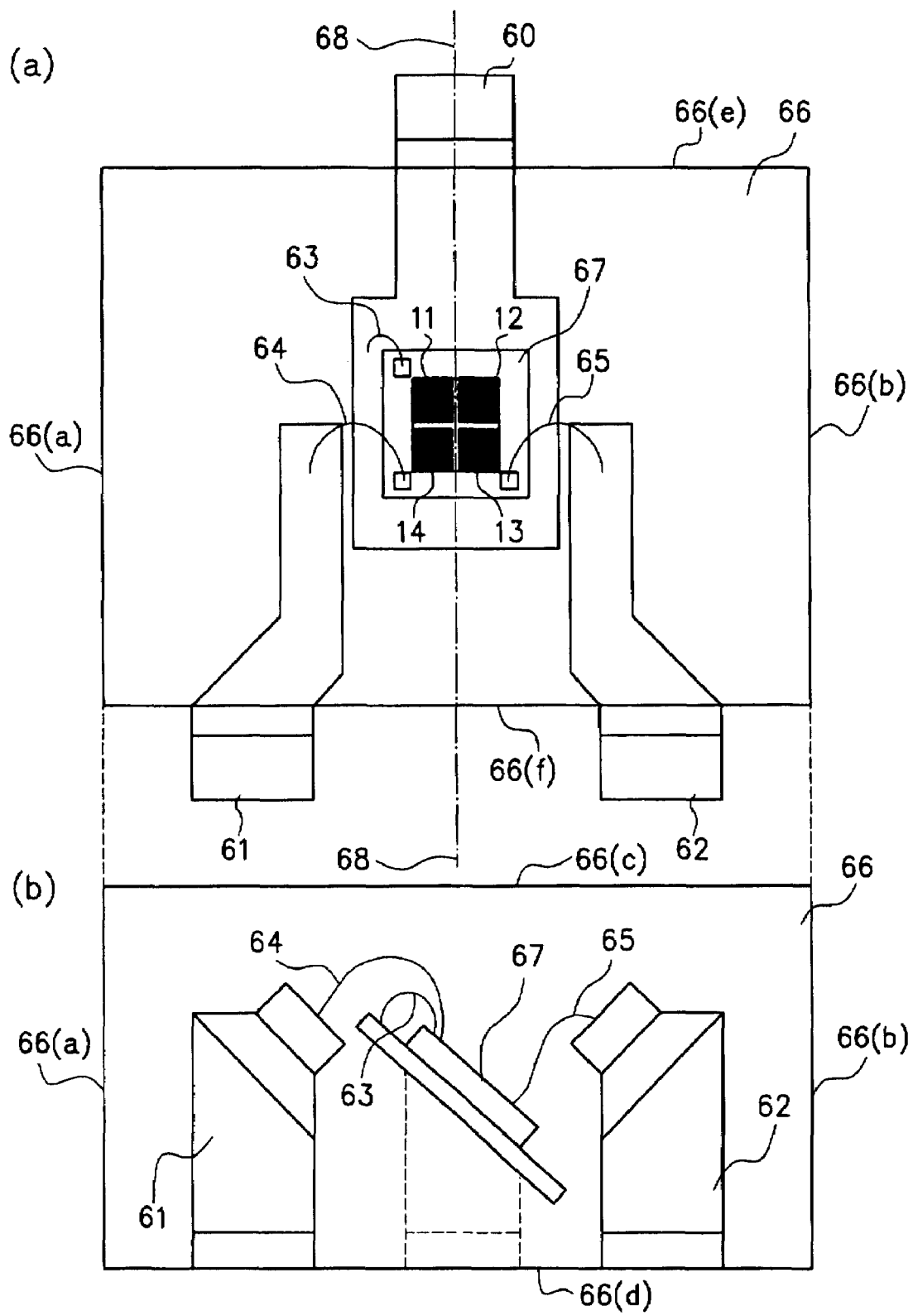
FIG. 1 shows a schematic configuration of a magnetic sensor according to a first embodiment.

FIG. 1 shows a schematic configuration of a magnetic sensor according to a first embodiment, a rotation detection device, or position detection device. FIG. 1A is a top view and FIG. 1B is a side view. Four thin-film magnetoresistance elements 11 to 14 are fabricated on a semiconductor substrate 67, and the semiconductor substrate 67 is connected to a lead frame 60 by a wire (wire bonding) 63 and mounted on the lead frame 60. Lead frames 61 and 62 on which the semiconductor substrate 67 is not mounted are connected to the semiconductor substrate 67 by wires 64 and 65.

Figure 5:
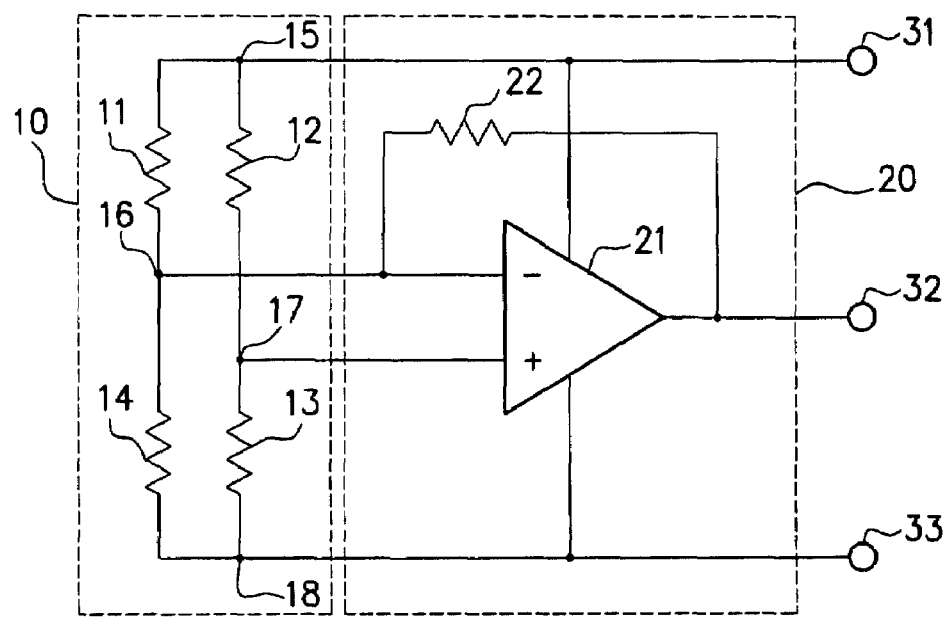
FIG. 5 shows a basic circuit configuration of a conventional magnetic sensor.

The magnetic sensor of the first embodiment has the circuit configuration similar to that of the conventional magnetic sensor. As shown in FIG. 5, the magnetic sensor of the first embodiment includes a magnetoresistance element unit 10 and an IC circuit waveform processing unit 20. The magnetoresistance element unit 10 forms a resistance bridge, and the middle points 16 and 17 are connected to inputs of the comparator circuit 21. The IC circuit waveform processing unit 20 includes the comparator 21 and the feedback resistance 22.

Figure 6:
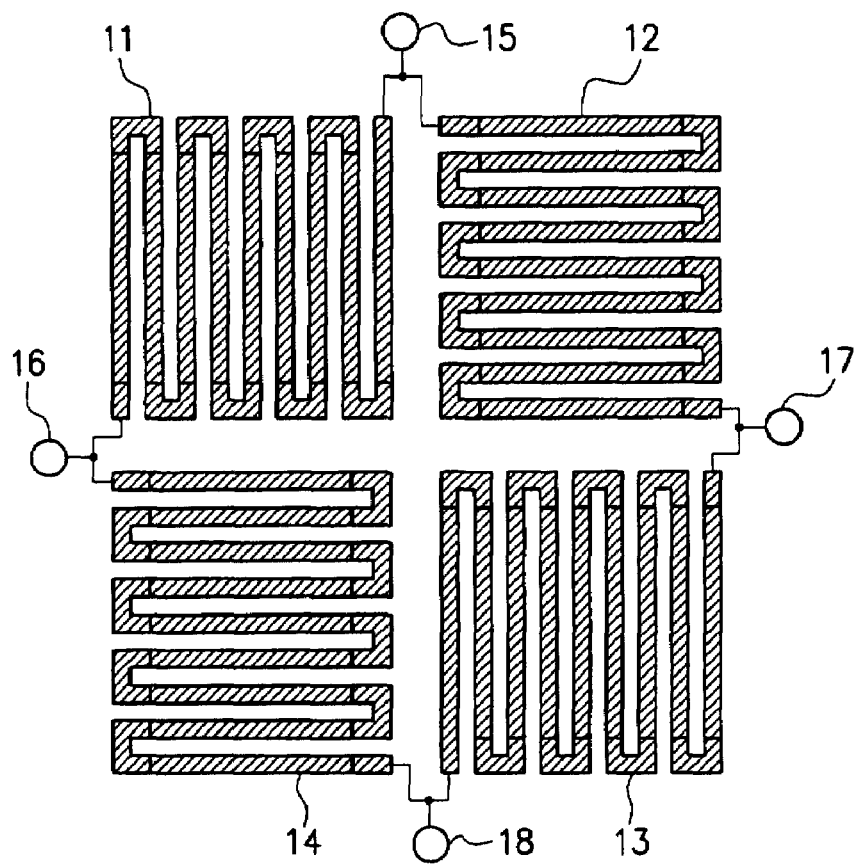
FIG. 6 shows a shape of a magnetoresistance element in the conventional magnetic sensor.
Figure 7:
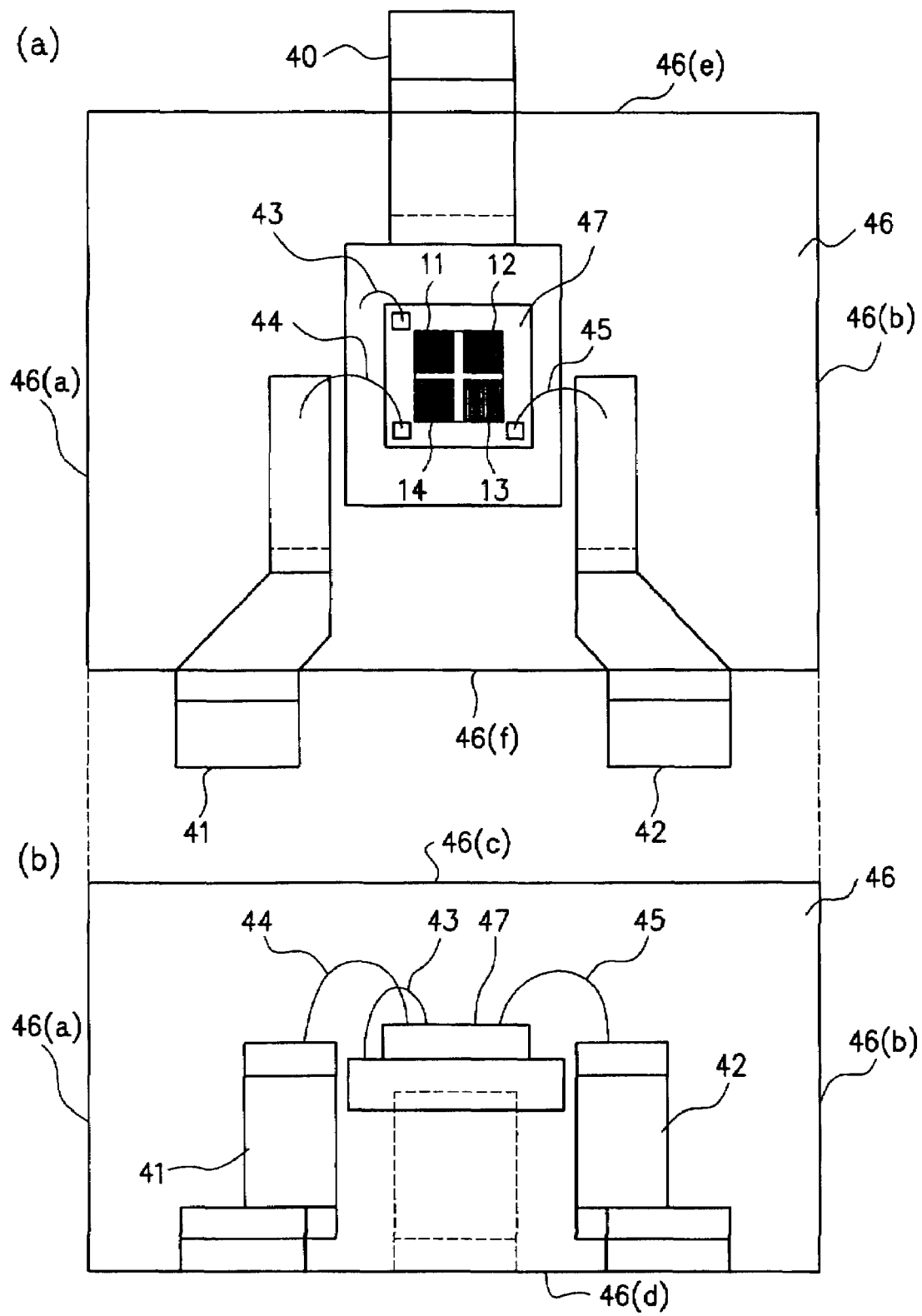
FIG. 7 shows a schematic configuration of the conventional magnetic sensor.
Figure 8:
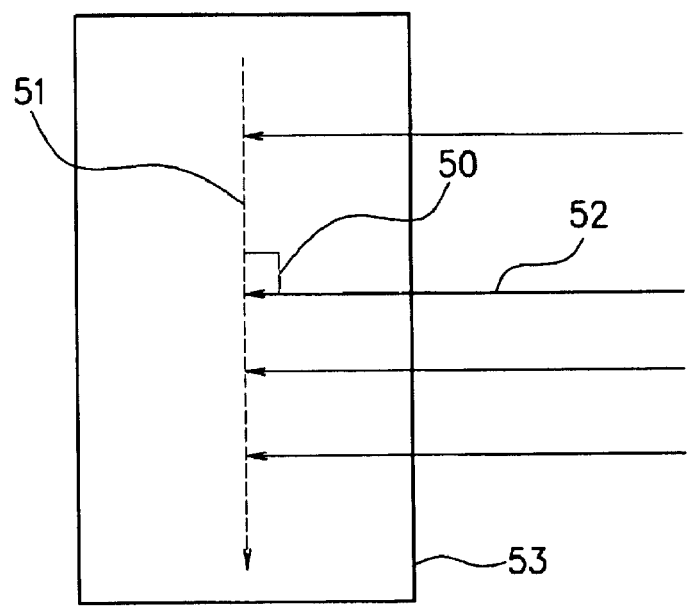
FIG. 8 is a diagram for explaining a magnetic detection operation of a magneto-resistor.

The magnetoresistance elements constitute the magnetoresistance element unit 10 as the conventional magnetoresistance elements. As shown in FIG. 6, the magnetoresistance elements 11 and 14 are connected in series, and the magnetoresistance elements 12 and 13 are connected in series. The cascaded magnetoresistance elements 11 and 14, and the magnetoresistance elements 12 and 13 are connected in parallel to a connection point 15 and a power supply terminal 31, and a connection point 18 and a GND terminal 33 to form a resistance bridge (a Wheatstone bridge). For the magnetoresistance elements 11 and 13, and the magnetoresistance elements 12 and 14, the arrangement is designed such that the orientations of the magnetoresistance elements responding to magnetic fields are orthogonal to each other. The magnetoresistance elements 11 to 14 have a continuously folded (meandering) structure. That is, the magnetoresistance elements 11 and 13 are arranged in the same direction, and the magnetoresistance elements 12 and 14 are oriented in the direction orthogonal to the magnetoresistance elements 11 and 13.

Lead frames 60 to 62 are rotated around an axis 68 that is parallel to a frame portion supporting a substrate attachment surface of the lead frame 60, and the lead frames 60 to 62 slope with respect to a package surface 66c which is a package's top surface or a package surface 66d which is a package's bottom surface. A semiconductor substrate 67 including the magnetoresistance elements 11 to 14 is mounted on the inclined lead frame 60, which allows the semiconductor substrate 67 to be arranged in the package with a predetermined angle. Though the lead frames 60 to 62 are inclined inside the package 66, one end of each lead frames 60 to 62 is parallel to the package surface 66c or the package surface 66d at the outside of the package.

The magnetic field detection will be described with reference to FIG. 9. A magnetic field perpendicular to the package surface 66c of FIG. 1, i.e., the magnetic field applied through the package surface 66c or 66d corresponds to the magnetic field 58 of FIG. 9, and the magnetoresistance element detects the magnetic field component 57 parallel to the surface of the semiconductor substrate. The magnetoresistance elements 11 and 13 react to the magnetic field. For example, when the lead frames 60 to 62 are inclined at an angle of 45°, the magnetic field component 57 becomes $1/\sqrt{2}$ times the magnetic field 58. This means that the $1/\sqrt{2}$-fold magnetic field is applied in the horizontal direction of the magnetoresistance elements 11 and 13.

The comparator 21 compares and amplifies the potential difference between the middle points 16 and 17, which is generated from the resistance changes of the magnetoresistance elements 11 and 13, and the comparator 21 transmits a change in electric signals to the output terminal 32. Thus, the magnetic detection is operated to the vertical magnetic field applied from above the package top surface.

Figure 9:
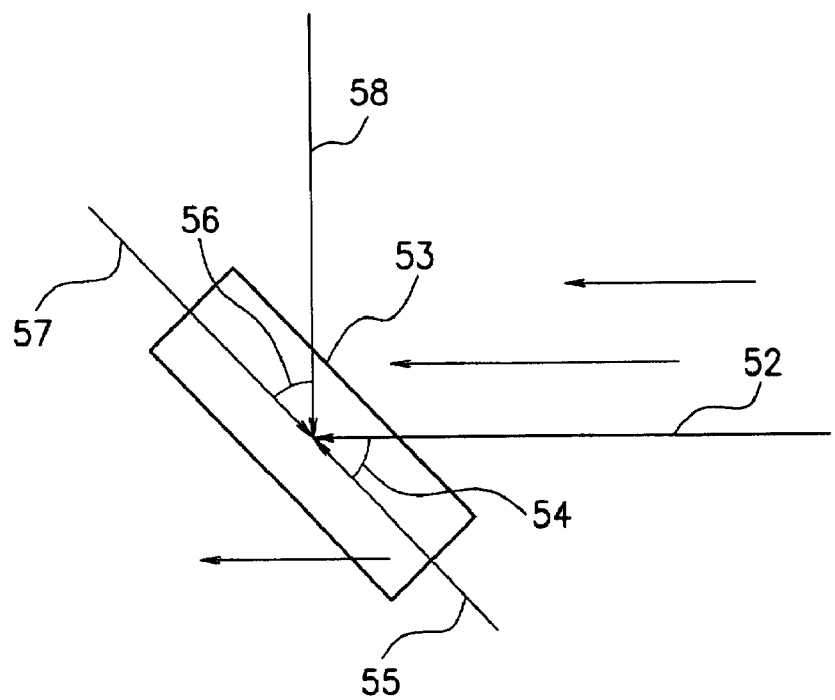
FIG. 9 is a diagram for explaining the magnetic detection operation of the magneto-resistor.

On the other hand, the magnetic field applied horizontally to the package surface 66c of FIG. 1, i.e., the magnetic field applied through the package surface 66a or 66b which is a package side face corresponds to the magnetic field 52 of FIG. 9, and a magnetoresistance element detects the magnetic field component 55 parallel to the semiconductor substrate surface. In the case where the lead frames 60 to 62 are inclined at the angle of 45°, the magnetic field component 55 becomes $1/\sqrt{2}$ times the magnetic field 52. This means that the $1/\sqrt{2}$-fold magnetic field is applied in the horizontal direction of the magnetoresistance elements 11 and 13. The comparison and amplification are performed to the potential difference that is generated from the resistance changes, and a signal is outputted as described above. In this way, the horizontal magnetic field applied through the package side surface is detected.

In the above configuration, the direction of the magnetic field impressed to the magnetoresistance elements 12 and 14, which respond to the application of the magnetic field in the canceling direction, is changed to realize a magnetic sensor that can suppress the influence on the application of the magnetic field in the canceling direction.

Figure 3:
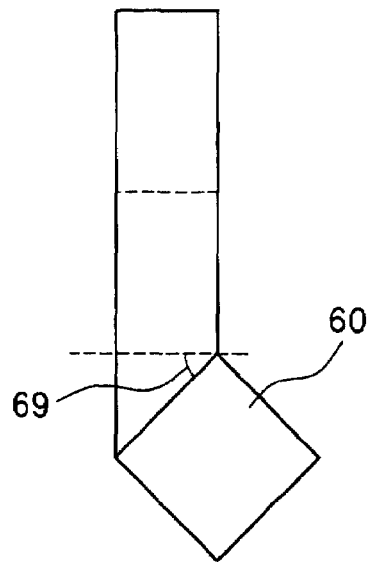
FIG. 3 shows a structure of a lead frame in the magnetic sensor according to the first embodiment.

FIG. 3 shows a structure of the lead frame 60 in the first embodiment, and a state before the lead frame 60 is bent. FIG. 3 is a top view of the lead frame 60 including a frame portion and a substrate attachment surface. The frame portion includes a rhombic part and a trapezoidal part below a dotted line, and the substrate attachment surface includes a rectangular part above the dotted line. A bending angle 69 is provided in the frame portion. A process of forming the bending angle 69 is summarized as follows. A portion where the bending angle 69 is provided is bent inward, and a boundary portion between the frame portion and the substrate attachment surface is bent outward. This enables the lead frame to be formed such that the substrate attachment surface is inclined relative to the surface (rhombic part) of the frame portion.

Angles of the bending angle 69 and a V-shape groove are equalized to the inclination angle of the frame substrate to define the inclination of the substrate. For example, when the lead frame 60 is inclined at 45° to set the horizontal magnetic field at $1/\sqrt{2}$ times the vertical magnetic field, the angles of the bending angle 69 and the V-shape groove are set at 45°. Thus, the V-shape groove is formed and the bending angle is determined, thereby allowing the stable inclination angle to be obtained with little return.

Then, a resin is injected using a mold to produce the package. In the case of the configuration shown in FIG. 1, the resin is injected from a package surface 66e or 66f, the package side face, and a technique of maintaining the formed frame angle is simultaneously performed to reduce the influence of the resin injection.

Second Embodiment

FIG. 2 shows a schematic configuration of a magnetic sensor according to a second embodiment. FIG. 2A is a top view and FIG. 2B is a side view. The second embodiment differs from the first embodiment in the inclinations of magnetoresistance elements on a semiconductor substrate, because lead frames 70 to 72 are inclined with respect to a package surface 76c or 76d based on an axis 78 that is orthogonal to a frame portion of the lead frame 70. In the first embodiment, the inclinations are provided such that the magnetoresistance elements 11 and 14 are located higher, and the magnetoresistance elements 12 and 13 are located lower. In the second embodiment, the inclinations are provided such that the magnetoresistance elements 11 and 12 are located lower while the magnetoresistance elements 13 and 14 are located higher. Therefore, the second embodiment differs from the first embodiment in the shape of the lead frames. Other configurations of the second embodiment are similar to those of the first embodiment.

The magnetic field detection will be described again with reference to FIG. 9. For example, in FIG. 2, when the magnetic field is applied through the package surface 76a or 76b, the magnetic field applied through the package surface 76e or 76f is a "canceling" magnetic field and corresponds to the magnetic field 58 (52?) of FIG. 9. A magnetic field that is applied through a package's side face so as to compensate the operating magnetic field acts on the magnetoresistance elements 12 and 14, and this is equivalent to the $1/\sqrt{2}$-fold magnetic field applied in the horizontal direction with respect to the magnetoresistance elements.

When the magnetic field is applied to the magnetoresistance elements 11 and 13 through the package surface 76a or 76b, even if the magnetic field in the canceling direction is applied through the package surface 76e or 76f so as to interrupt the detection operation, the influence of the magnetic field in the canceling direction can be suppressed because the magnetoresistance elements and the semiconductor substrate are inclined.

For the magnetic field applied perpendicular to the package surface 76c or 76d, as with the first embodiment, the magnetoresistance elements 11 and 13 detect the magnetic field component parallel to the semiconductor substrate surface.

Figure 4:
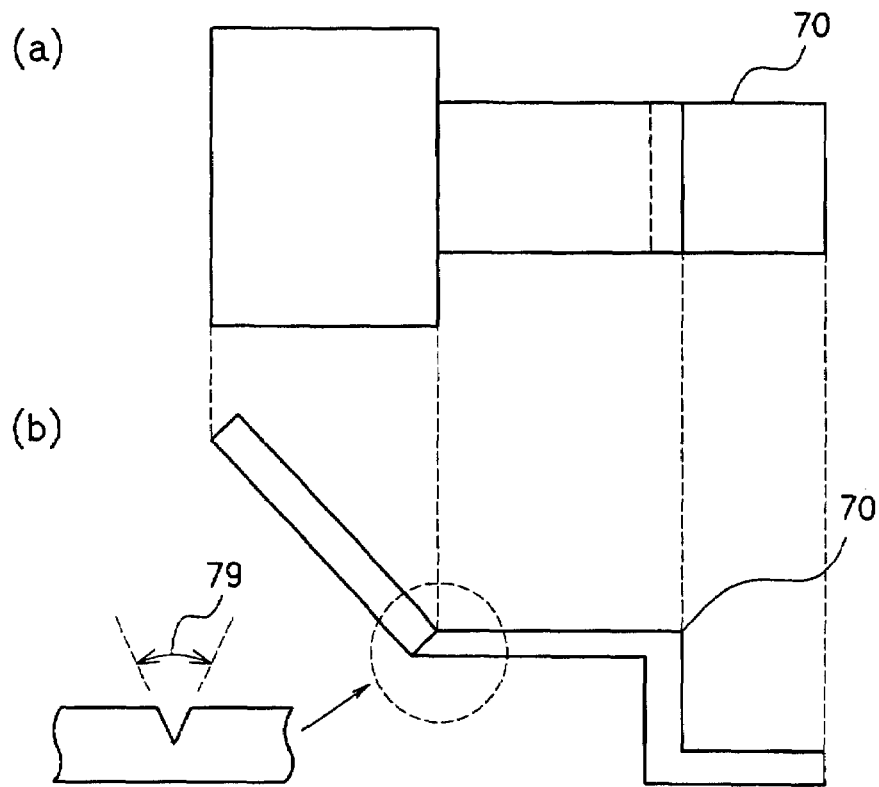
FIG. 4 shows a structure of a lead frame in the magnetic sensor according to the second embodiment.

FIG. 4 shows a structure of a lead frame 70 in the second embodiment. FIG. 4A is a top view and FIG. 4B is a side view. A lengthwise long rectangle on the left side is a substrate attachment surface, and a crosswise long rectangle on the right side is a frame portion. As shown in FIG. 4B, the frame portion is formed in a stair-like shape, and the substrate attachment surface is inclined by bending the boundary portion between the substrate attachment surface and the frame portion. A V-shape groove is provided in the boundary portion.

An angle to bend the lead frame 70 and a V-shape groove angle 79 of the boundary portion are equal to the inclination angle of the frame substrate. This defines the inclination of the substrate attachment surface. When the lead frame 70 is inclined at 45° to set the horizontally-applied magnetic field at $1/\sqrt{2}$ times the vertically-applied magnetic field, the bent angle and the V-shape groove 79 is set at 45°. A V-shape groove having the angle of 45° is cut on the lead frame 70 and the lead frame 70 is bent to obtain the stable inclination angle with little return on the bending the lead frame 70.

Resin is injected using a mold to produce a package. In the second embodiment, the resin is injected from the package surface 76a or 76b, and simultaneously, the technique of maintaining the formed frame angle is used to reduce the influence of the resin injection.

Although the preferred embodiments are described above by way of example, the invention is not limited to the embodiments. Various changes and modifications could be made without departing from the spirit and scope of the invention.

According to the above embodiments, the semiconductor substrate in which thin-film magnetoresistance elements are formed is inclined relative to the bottom surface and the top surface of a package while mounted on a lead frame, thereby enabling the magnetic sensor to detect both the horizontal magnetic field applied through the package side face and the vertical magnetic field applied through the top surface and bottom surface of the package. Therefore, a degree of freedom is increased in the operating direction of magnetic detection, and the performance of the sensor can be improved in detecting the magnetic field.

According to the above embodiments, a semiconductor substrate on which thin-film magnetoresistance elements are formed is inclined relative to the bottom surface and top surface of a package while mounted on a lead frame, thereby enabling the detection sensitivity of the magnetoresistance elements to be controlled over the magnetic field applied in the canceling direction that interrupts the sensing operation. Therefore, because the magnetic sensor is hardly influenced by the ambient magnetic field, the performance can be improved while particular sensitivity characteristics of the magnetic sensor are maintained.

According to the above embodiments, a V-shape groove is provided in the bent portion of the lead frame to specify a bent angle, and thereby the amount of return after bending the lead frame can be reduced to stably realize the bending. Therefore, because the bending accuracy is ensured in bending a lead frame, detection sensitivity can be adjusted and the magnetic detection property can be improved.

What is claimed is:

1. A magnetic sensor comprising:
   a magnetoresistance element unit including meandering thin-film magnetoresistance elements;
   an IC circuit waveform processing unit including a comparator circuit and a feedback resistance, the magnetoresistance element unit and the IC circuit waveform processing unit being on a semiconductor substrate;
   the semiconductor substrate that is connected to both the magnetoresistance element unit and the IC circuit waveform processing unit;
   a first lead frame on which the semiconductor substrate is mounted, the semiconductor substrate and the first lead frame being included in a package, the first lead frame slopes against the surface of the package; and
   a pair of lead frames formed on either side of the first lead frame at a slope reciprocal to the slope of the first lead frame, the pair of lead frames structurally separate and connected by a wire to the first lead frame,
   wherein:
   the magnetoresistance element unit includes magnetoresistance elements that meander in different directions and forms a Wheatstone bridge.

2. The magnetic sensor according to claim 1, wherein the semiconductor substrate is mounted on the first lead frame, the semiconductor substrate having the magnetoresistance element unit including a Wheatstone bridge.

3. The magnetic sensor according to claim 1, wherein the first lead frame includes a stage portion to which the semiconductor substrate is attached and a frame portion that supports the stage portion, and the frame portion is bent to adjust an angle of a surface of the stage portion against a surface of the package.

4. The magnetic sensor according to claim 3, wherein a V-shape groove is cut on the frame portion.

5. The magnetic sensor according to claim 3, wherein the semiconductor substrate is attached to the stage portion that is at angle to an axis parallel to the frame portion.

6. The magnetic sensor according to claim 3, wherein the semiconductor substrate is attached to the stage portion that is at an angle to an axis orthogonal to the frame portion.

7. A method for producing a magnetic sensor comprising a magnetoresistance element unit and an IC circuit waveform processing unit on a semiconductor substrate, the semiconductor substrate mounted on a first lead frame that includes a frame portion and a stage portion, a pair of lead frames, the method comprising the step of:
   bending the frame portion;
   adjusting an angle of the stage portion against a surface of a package;
   attaching the semiconductor substrate to a surface of the stage portion; and
   bending the pair of lead frames around at a slope reciprocal to the slope of the first lead frame supporting a substrate attachment surface of the first lead frame and connecting the pair of lead frames formed structurally separate by a wire to the first lead frame.

8. The magnetic sensor production method according to claim 7, wherein a V-shape groove is cut on the frame portion to adjust the angle of the stage portion.

* * * * *